United States Patent [19]
Novosel

[11] Patent Number: 5,455,776
[45] Date of Patent: Oct. 3, 1995

[54] AUTOMATIC FAULT LOCATION SYSTEM

[75] Inventor: Damir Novosel, Raleigh, N.C.

[73] Assignee: ABB Power T & D Company Inc., Blue Bell, Pa.

[21] Appl. No.: 118,000

[22] Filed: Sep. 8, 1993

[51] Int. Cl.⁶ .......................... G01R 31/00; G01R 31/08
[52] U.S. Cl. .......................... 364/492; 364/481; 364/483; 324/509; 324/521; 361/88
[58] Field of Search .......................... 364/492, 483, 364/481; 324/51, 52, 509, 521; 340/870.28, 662; 361/80, 85, 86, 88

[56] References Cited

U.S. PATENT DOCUMENTS

| | | | |
|---|---|---|---|
| 3,590,368 | 6/1971 | Esclangon | 324/51 |
| 4,107,778 | 8/1978 | Nii et al. | 364/492 |
| 4,128,805 | 12/1978 | Lanz | 324/52 |
| 4,281,386 | 7/1981 | Kondow et al. | 364/492 |
| 4,313,169 | 1/1982 | Takagi et al. | 364/492 |
| 4,314,199 | 2/1982 | Yamaura et al. | 324/52 |
| 4,455,612 | 6/1984 | Girgis et al. | 364/483 |
| 4,795,983 | 1/1989 | Crockett et al. | 324/521 |
| 4,797,805 | 1/1989 | Nimmersjö | 364/481 |
| 4,803,635 | 2/1989 | Andow | 364/492 |
| 4,812,995 | 3/1989 | Girgis et al. | 364/481 |
| 4,851,782 | 7/1989 | Jeerings et al. | 324/520 |
| 4,871,971 | 10/1989 | Jeerings et al. | 324/509 |
| 4,906,937 | 3/1990 | Wilkström et al. | 324/509 |
| 4,998,098 | 3/1991 | Schweitzer, III | 340/662 |
| 5,072,403 | 12/1991 | Johns | 364/492 |
| 5,181,026 | 1/1993 | Granville | 340/870.28 |

OTHER PUBLICATIONS

Doctoral Dissertation of Muchuan M. Chen, "Managerial Relaying: An Adaptive Approach to a System Protection Problem," University of Pennsylvania, Mar. 1974.

M. S. Sachdev, et al., "A Technique For Estimating Transmission Line Fault Locations From Digital Relay Measurements," IEEE Transactions on Power Delivery.

Adly A. Girgis et al, "A New Fault Location Technique For Two–and Three–Terminal Lines," IEEE Transactions on Power Delivery, vol. 7, No. 1, Jan. 1992, pp. 98–107.

*Primary Examiner*—Ellis B. Ramirez
*Assistant Examiner*—Patrick J. Assouad
*Attorney, Agent, or Firm*—Woodcock, Washburn, Kurtz, Mackiewicz & Norris

[57] ABSTRACT

A fault location system comprises voltage/current transducers 10A, 10B located at terminals A and B, respectively; digital relays 12A and 12B respectively coupled to transducer blocks 10A and 10B; and a fault location estimation processor 14, which may comprise a substation controller at substation $S_A$ or substation $S_B$, a relay at A or B, a stand alone computer at A or B, or a computer at a central location. The digital relays receive analog voltage and current signals ($V_A$, $I_A$, $V_B$, $I_B$) from the respective transducers and output digital phasor or oscillographic data to the fault location estimation block. The fault location estimation block is programmed to provide the fault location parameter m. The fault location estimation provided by the inventive technique is unaffected by the fault resistance, load current, mutual coupling effects from a parallel line, uncertainties in zero sequence values, shunt elements, and X/R characteristic of the system. The fault location can be estimated accurately even in cases of substantial resistance and load flow. In addition, the invention does not require synchronization of the data received from the respective A and B terminals, nor does it require pre-fault data or fault type selection.

6 Claims, 5 Drawing Sheets

NORMAL BALANCED
CONDITIONS

*Fig. 1A*

NOTE:
AT THE FAULT
$V_{ab} = V_{bc} = V_{ca} = 0$

THREE PHASE FAULT

*Fig. 1B*

NOTE:
AT THE FAULT $V_{bc} = 0$

PHASE "b"-TO-PHASE "c"
FAULT

*Fig. 1C*

NOTE:
AT THE FAULT
$V_{bc} = V_{bg} = V_{cg} = 0$

PHASE "b" TO-PHASE-
"c"-TO-GROUND FAULT

*Fig. 1D*

PHASE "a" TO-GROUND FAULT

NOTE:
AT THE FAULT $V_{ag} = 0$

*Fig. 1E*

PRIOR ART

Fig. 2A

PRIOR ART

AUTOMATIC FAULT LOCATION SYSTEM

FIELD OF THE INVENTION

The present invention relates generally to the field of protective relaying, and relates more particularly to a system for automatically locating faults on an electrical transmission or subtransmission line.

BACKGROUND OF THE INVENTION

Protective relaying generally involves the performance of one or more of the following functions in connection with a protected power or energy system: (a) monitoring the system to ascertain whether it is in a normal or abnormal state; (b) metering, which involves measuring certain electrical quantities; (c) protection, which typically involves tripping a circuit breaker in response to the detection of a short-circuit condition; and (d) alarming, which provides a warning of some impending problem. Fault location is associated with the protection function. It involves measuring critical system parameters and, when a fault occurs, quickly making an estimate of the fault location so that the faulted line can be returned to service as quickly as possible.

The major types and causes of faults are: (1) insulation faults, caused by design defects, manufacturing defects, improper installation, and aging insulation; (2) electrical faults, caused by lightning surges, switching surges, and dynamic overvoltages; (3) mechanical faults, caused by wind, snow, ice, and contamination; and (4) thermal faults, caused by overcurrent and overvoltage conditions.

Figure 1A:
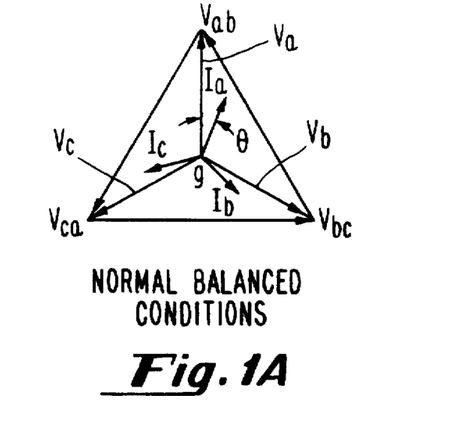
FIGS. 1A–1E are phasor diagrams depicting the effects of various types of solid faults on the currents and voltages of a typical power system.
Figure 1B:
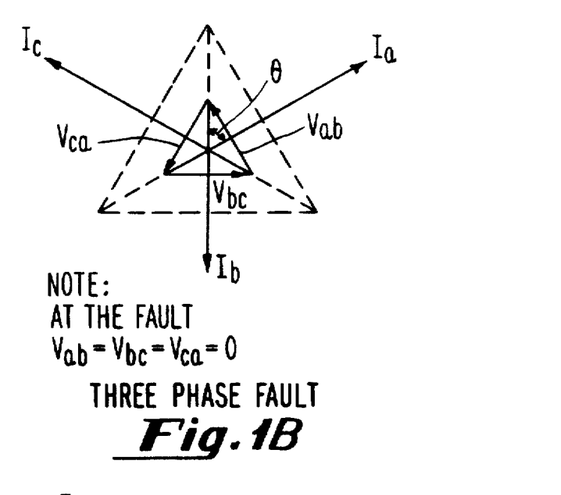
Figure 1C:
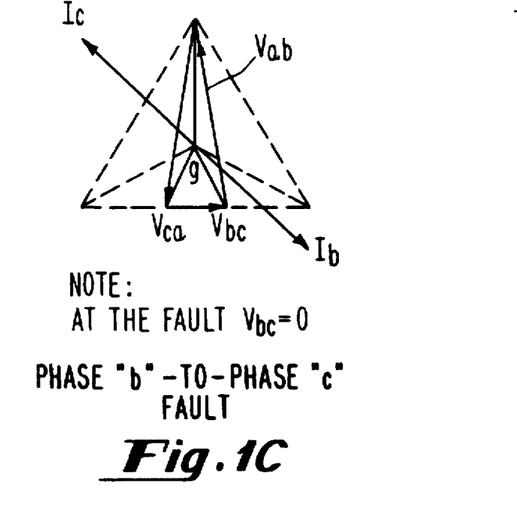
Figure 1D:
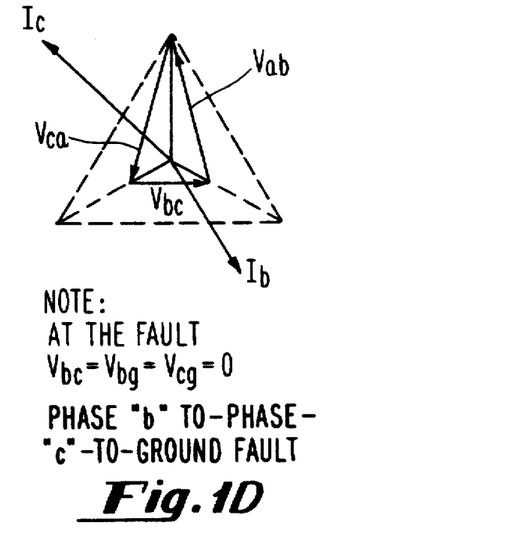
Figure 1E:
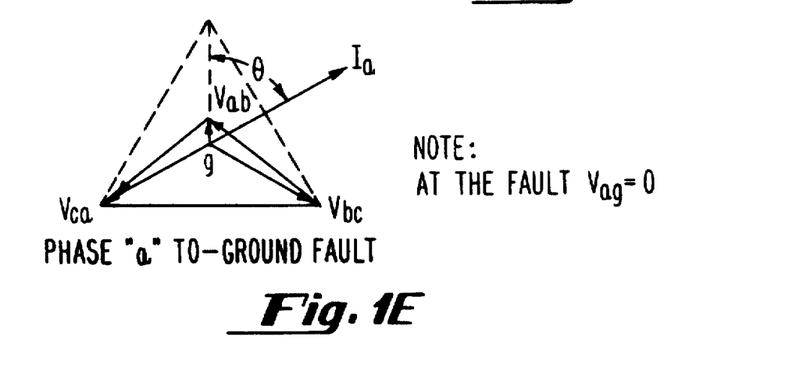

A fault may cause current in one or more of the phase lines (referred to herein as the "a", "b", and "c" phases) to be diverted to ground, to a neutral line (denoted "n"), or to another phase line. The phasor diagrams in FIGS. 1A–1E illustrate the effect of faults on the system voltages and currents. The diagrams are for effectively grounded systems wherein the neutral is solidly grounded. In addition, the diagrams are for the ideal case of a zero fault resistance ($R_F=0$). (Many of the prior art fault location systems work well with such an ideal case. The present invention is directed to cases involving non-zero fault resistance.) However, they are illustrative of the effects of faults on other types of systems, e.g., ungrounded and impedance grounded systems. In the diagrams, the dotted, uncollapsed voltage triangle exists in the source (the generator) and the maximum collapse is at the fault location. The voltages between the source and fault will vary between these extremes. The diagrams depict the effects of various types of faults on the currents and voltages (represented by phasors) in the system. FIG. 1A depicts the phasors for normal, balanced conditions; FIG. 1B depicts the phasors for a three-phase fault ($V_{ab}=V_{bc}=V_{ca}=0$ at the fault); FIG. 1C depicts the phasors for a phase b-to-phase c fault ($V_{bc}=0$ at the fault); FIG. 1D depicts the phasors for a phase b-to-phase c-to-ground fault ($V_{bc}=V_{bg}=V_{cg}=0$ at the fault); and FIG. 1E depicts the phasors for a phase a-to-ground fault ($V_{ag}=0$ at the fault).

The present invention relates to fault location in connection with electrical conductors of a power transmission system. One function of protective relaying systems is to estimate the location and resistance of the fault. For example, as described in U.S. Pat. No. 4,906,937, Mar. 6, 1990, titled "Method and a Device for Fault Location in the Event of a Fault on a Power Transmission Line" (assigned to Asea Brown Boveri AB, Vasteras, Sweden), it is normally desirable to estimate the distance from a measuring station to a possible fault and to determine the magnitude of the fault resistance.

The basic principles of fault location are well known. Typically, measured values are obtained with the aid of measuring transformers in a relay located adjacent to a protected line. Present-day techniques employ analog-to-digital (A/D) conversion and filtering of the measured values. The filtered digital values are then processed by various equations to determine the fault distance and the magnitude of the fault resistance.

Figure 2A:
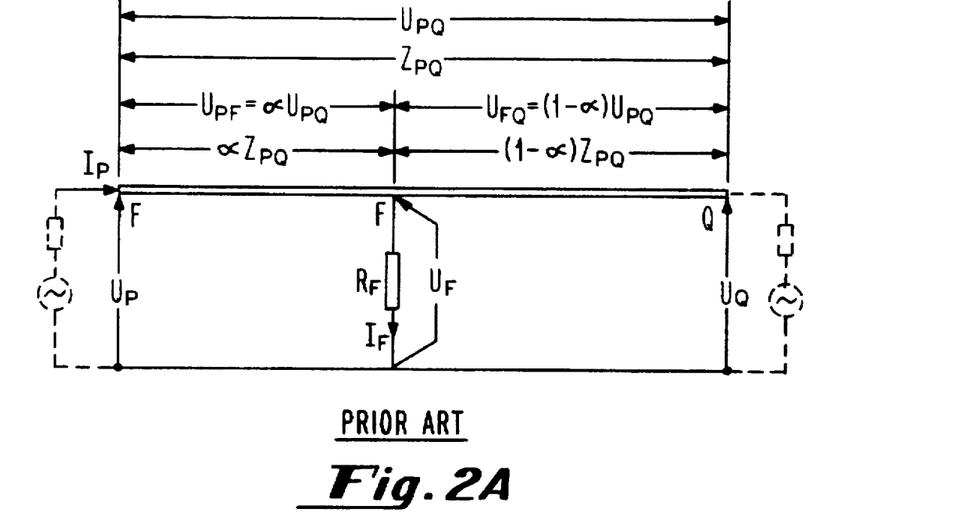
FIG. 2A is a schematic diagram of a faulted transmission line section.

There are several known distance protection equations. Two of the most ordinary ones will be briefly described with reference to FIG. 2A, which depicts a line between stations P and Q on which a fault to ground has arisen at point F. Both of these equations assume knowledge of the faultless line impedance $Z_{PQ}$ on the protected line segment between two measuring stations P and Q. After the detection of a fault, the voltages $U_P$ and $U_Q$ and the currents $I_P$ and $I_Q$ are measured in the respective stations. To eliminate the need for communication between the stations, the values measured at one of the stations are employed as a starting-point. If the assumption is made that a current $I_F$ flows through a fault resistance $R_F$, producing a voltage $U_F$ across the fault resistance, the following relationship can be assumed:

$$U_P = U_{PF} + U_F = \alpha U_{PQ} + U_F = \alpha Z_{PQ} I_P + R_F I_F \quad (0.1)$$

where $\alpha$ is a parameter having a value in the range 0 to 1 and is an assumed measure of the fault position, and $U_{PQ}$ is an estimate of the voltage drop across the entire line. The $U_{PQ}$ estimate is determined with the aid of $I_P$, which is measured.

Equation (0.1) is not directly solvable because it contains too many unknown parameters (i.e., $U_{PF}$, $U_F$, $\alpha$, $R_F$, $I_F$ are unknown quantities). Therefore, certain assumptions must be made. It is common to assume that the fault current $I_F$ is proportional to the current measured in station P. That is, it is assumed that $$I_F = k_1 I_P \quad (0.2)$$

This assumption is fulfilled if the voltages $U_P$ and $U_Q$ at P and Q have equal phases and if the phase angles for the impedances from the fault location F to the respective stations P, Q are equal. (This condition may be expressed: $X_S/R_S = X_R/R_R = X_L/R_L$, where $X_S$ and $X_R$ and $X_L$ respectively represent the source-end, remote-end, and line reactance, and $R_S$, $R_R$, and $R_L$ respectively represent the source-end, remote-end, and line resistance.) Equation (0.1) can then be written:

$$U_P = \alpha Z_{PQ} I_P + R_F k_1 I_P = \alpha Z_{PQ} I_P + R_{F1} I_P \quad (0.3)$$

where $R_{F1}$ is an apparent fault resistance.

Another variant of the necessary assumption is to assume that the fault current is proportional to the current change at P when a fault has occurred. That is, it is assumed that $$I_F = k_2 \Delta I_P \quad (0.4)$$

Therefore, equation (0.1) can be expressed:

$$U_P = \alpha Z_{PQ} I_P + R_F k_2 \Delta I_P = \alpha Z_{PQ} I_P + R_{F2} \Delta I_P \quad (0.5)$$

Equations (0.3) and (0.5) each comprise two unknown parameters, $\alpha$ and $R_{F1}$ or $R_{F2}$, respectively. This means that a linear regression (or some other problem solving technique) is required to solve for the unknown parameters.

When distance protection devices with fault location are used in connection with high voltage transmission lines, capacitive voltage transformers (CVTs) are usually used for the voltage measurement. It is well known that such voltage measurement devices cause measurement error voltages, called "CVT transients."

Figure 2B:
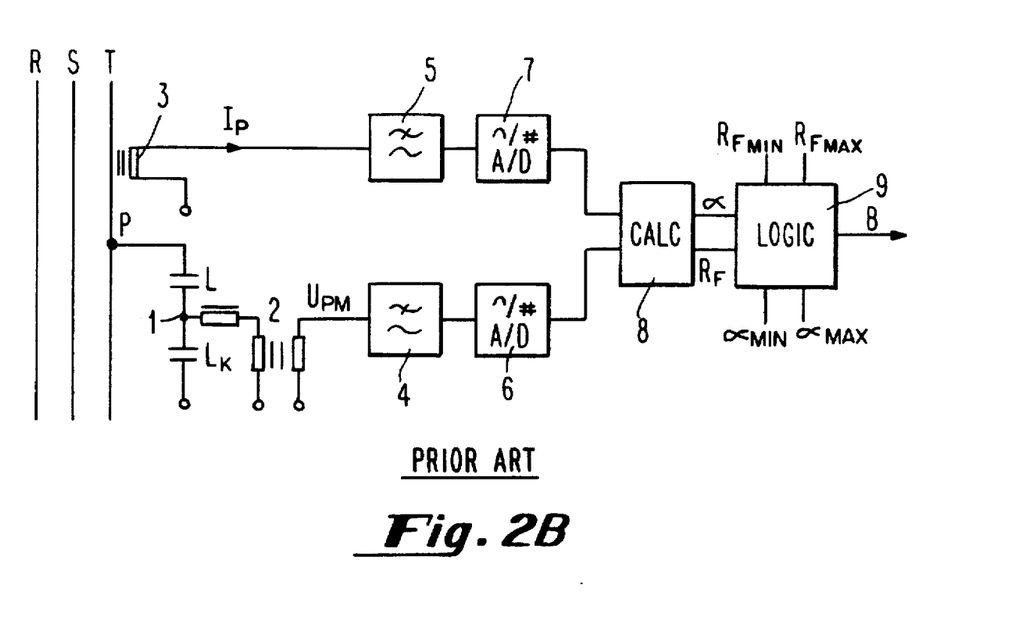
FIG. 2B is a schematic diagram of one prior art fault location system.

The above cited U.S. Pat. No. 4,906,937 describes a fault location system that specifically addresses the problem of CVT transients. The disclosed system is depicted schematically in FIG. 2B. As described in the patent, phase voltages $U_P$ and phase currents $I_P$ are measured on a high voltage network RST at a measuring station P. The patent discloses that either of the following two distance protection equations may be employed as a starting-point:

$$U_{PM1} = \alpha Z_{PQ} I_P + R_{F1} I_P + \Delta U_{CVT} \tag{0.6}$$

$$U_{PM2} = \alpha Z_{PQ} I_P + R_{F2} \Delta I_P + \Delta U_{CVT} \tag{0.7}$$

If equation (0.6) is made the starting-point, the device for fault location is continuously switched and controls the state of the line. If equation (0.7) is made the starting-point, a least prescribed change of $I_P$ must be assumed to initiate the control of the state of the line. The measuring voltage $U_{PM}$ is obtained via a capacitive voltage divider 1 and a conventional transformer 2. The current $I_P$ is measured with a current transformer 3. The measured values are low-pass filtered in filters 4 and 5. The filtered voltage and current signals are converted to digital data by analog-to-digital conversion devices 6, 7. The instantaneous digitalized current and voltage values are supplied to a calculator 8, which processes the data to obtain estimated values of: $\alpha$, representing the fault position; $R_{F1}$ and $R_{F2}$, respectively representing the apparent fault resistance; and $\Delta U_{CVT}$, representing the fault voltage. The values of $\alpha$, $R_{F1}$, and $R_{F2}$ are supplied to a logic unit 9 for comparison with upper and lower limit values $\alpha_{min}$, $\alpha_{max}$, $RF_{min}$, and $RF_{max}$, respectively. If the $\alpha$ and RF values lie within the stated limits, a decision B to trip is given.

A disadvantage of some prior art fault location systems is that non-linearities associated with the fault (e.g., a non-linear fault resistance $R_F$) adversely influence the accuracy of the fault location estimation. Prior art systems that employ data obtained from opposite sides of the fault purportedly are capable of estimating the location of non-linear faults. For example, U.S. Pat. No. 5,072,403, Dec. 10, 1991, titled "Equipment for and Methods of Locating the Position of a Fault on a Power Transmission Line," discloses such a system. However, this and similar known systems assume that the data samples from the respective ends of the line are synchronized, i.e., sampled at the same time, and that the computed phase angles of the currents and voltages are relative to a common reference. A GPS (global positioning system) satellite has been employed to achieve such synchronization. Nonetheless, the requirement of such synchronization is a disadvantage in that it increases the cost and complexity and reduces the reliability of the system.

Another disadvantage of some prior art fault location systems is that they employ algorithms that are influenced by (1) the combined effects of the values of the fault resistance and load, (2) the outside network, (3) an unbalanced load, (4) a capacitance parallel to the fault, and (5) a line in parallel to the faulted line. The enumerated items adversely affect the accuracy and reliability of the fault location estimation provided by these systems. Moreover, some systems lose accuracy when used in association with long transmission lines (e.g., lines of about 150 miles or longer). This is because they employ a transmission line model (impedance or II) that does not recognize the distributed nature of the line impedance and admittance parameters (these distributed parameters are referred to hereinbelow as $Z_{ld}$ and $Y_{ld}$).

SUMMARY OF THE INVENTION

The present invention provides a fault location system for locating a fault associated with one or more conductors of an electric power transmission or distribution system. According to the invention, such a system comprises a first transducer set for measuring a first voltage ($V_A$) and a first current ($I_A$) at a first prescribed location on at least one conductor; (b) a second transducer set for measuring a second voltage ($V_B$) and a second current ($I_B$) at a second prescribed location on the at least one conductor; (c) a first relay for generating data ($V_{Af}$, $I_{Af}$) indicative of an amplitude and phase of the first voltage and current; (d) a second relay for generating data ($V_{Bf}$, $I_{Bf}$) indicative of an amplitude and phase of the second voltage and current; and (e) a fault location estimation processor for generating a fault location parameter m indicative of the location of the fault. The data indicative of amplitude and phase referred to above may be phasor data or oscillographic. In embodiments wherein the relays provide oscillographic data, the fault location estimation processor would determine phase angle data on the basis of amplitude data sampled over one or more cycles of the underlying signal (i.e., the sampled current or voltage).

The fault location parameter m in one preferred embodiment of the invention is obtained from one of the following equations (denoted herein as (19a) and (19b)):

$$m = \frac{Re(\overline{V_{Af}})^*\cos\delta - Im(\overline{V_{Af}})^*\sin\delta - Re(\overline{V_{Bf}}) + C}{A^*\cos\delta - B^*\sin\delta + C} \tag{19a}$$

$$m = \frac{Re(\overline{V_{Af}})^*\sin\delta + Im(\overline{V_{Af}})^*\cos\delta - Im(\overline{V_{Bf}}) + D}{A^*\sin\delta + B^*\cos\delta + D} \tag{19b}$$

In the above equations, $\delta$, which is calculated by the fault location system, represents a phase difference between the first and second voltages, A is a real number having a value which is a first predetermined function of $I_{Af}$ and a resistance and reactance of the at least one conductor, B is a real number having a value which is a second predetermined function of $I_{Af}$ and the resistance and reactance of the at least one conductor, C is a real number having a value which is a first predetermined function of $I_{Bf}$ and the resistance and reactance of the at least one conductor, and D is a real number having a value which is a fourth predetermined function of $I_{Bf}$ and the resistance and reactance of the at least one conductor. Other details of the calculations performed by preferred embodiments are specified below.

Preferred embodiments of the invention also include means for compensating for shunt elements.

In addition, preferred embodiments include means for compensating for long lines. Preferably, an ABCD model is employed to achieve such compensation.

The preferred implementation is in connection with a three-phase system by using positive or negative sequence networks. This specification describes the invention by referring to a single line implementation (as opposed to a three-phase implementation). This simplification is not to be interpreted as limiting the invention to a single line system.

As described in detail below, the present invention provides a technique for automatically estimating the location of a fault on a transmission and/or subtransmission line. The invention may be carried out by using oscillographic and/or phasor data from protective relays. In addition, the invention does not require synchronization of the data received from the respective A and B terminals, nor does it require pre-fault data. (The data from the respective A and B terminals may be collected at much different times (e.g., one hour apart). In addition, no time tagging of the data is required.) Moreover, the fault location estimation provided by the inventive technique is unaffected by the fault resistance, load current, mutual coupling effects from a parallel line, uncertainties in zero sequence values, shunt elements, and X/R characteristic (reactance over resistance ratio) of the system (i.e., the outside network does not influence the accuracy of the solution). Thus, the fault location may be estimated accurately even in cases of substantial fault resistance and load flow. Moreover, fault type selection is not required.

Other features and advantages of the present invention are described below.

DETAILED DESCRIPTION OF PREFERRED EMBODIMENTS

The present invention provides methods and apparatus for estimating a fault location parameter that is indicative of the location of the fault. In preferred embodiments of the invention, voltage and current phasors (denoted herein with overlines) from two terminals of a protected line are required (however, it is not necessary that these phasors be provided by a protective relay per se, as they could be computed in a separate processor). An important feature of the invention is that these phasors do not have to be synchronized. Moreover, a fault-type identification is not required. The invention may be implemented as part of a fault-location software package for use with a protective relaying system.

Figure 3:
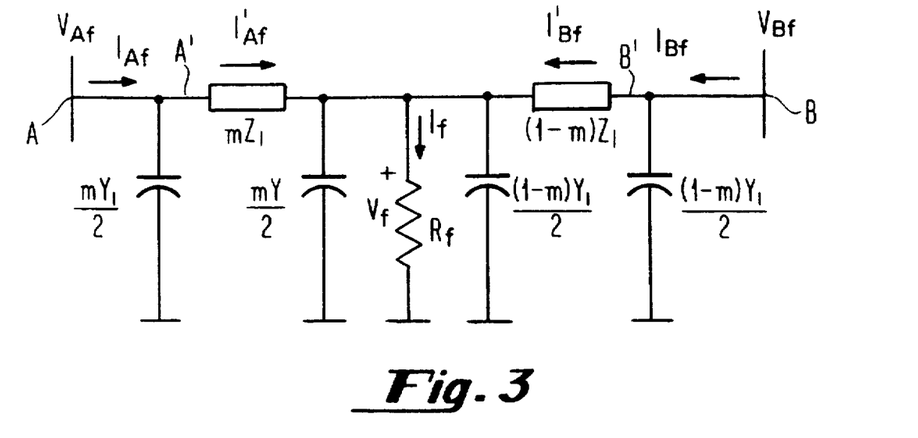
FIG. 3 is a single-line model of a faulted transmission line. This model is referred to below in explaining the present invention.

FIG. 3 is a single-line model of a faulted transmission line. The elements of the model represent physical quantities as follows:

$\overline{V_{Af}}$: Measured voltage at terminal A
$\overline{V_{Bf}}$: Measured voltage at terminal B
$\overline{I_{Af}}$: Measured current at terminal A
$\overline{I_{Bf}}$: Measured current at terminal B
$\overline{I'_{Af}}$: Calculated current at A'
$\overline{I'_{Bf}}$: Calculated current at B'
$Z_l$: Line impedance
$Y_l$: Line admittance
$\overline{V_f}$: Fault voltage
$\overline{I_f}$: Fault current
$R_f$: Fault resistance
m: Relay-to-fault reach (distance) on a scale of 0–1 (m is similar to α, referred to above in discussing the prior art).

The data processing aspect of the invention will now be derived with reference to FIG. 3. The voltage at the fault location may be expressed as in equation (1) or equation (2):

$$\overline{V_f} = \overline{V_{Af}} - m\overline{Z_l} * \overline{I_{Af}} \tag{1}$$

$$\overline{V_f} = \overline{V_{Bf}} - (1-m)\overline{Z_l} * \overline{I_{Bf}} \tag{2}$$

Subtracting equation (1) from equation (2) and rearranging, it follows that:

$$\overline{V_{Af}} - \overline{V_{Bf}} + \overline{Z_l} * \overline{I_{Bf}} = m * \overline{Z_l} * (\overline{I_{Af}} + \overline{I_{Bf}}) \tag{3}$$

Since the measurements at buses A and B will typically be unsynchronized, there will typically be an angle between corresponding phasors. This angle is denoted δ. For example, voltages at buses A and B that will satisfy equation (3) can be written as:

$$\overline{V_{Af}} = V_{Af} \angle \alpha_m + \delta \rangle; \overline{V_{Bf}} = V_{Bf} \angle \beta_m \rangle \tag{4}$$

where $\alpha_m$ and $\beta_m$ are measured angles. Similar equations can be written for current phasors. Thus, equation (3) may be transformed to:

$$\overline{V_{Af}} * e^{j\delta} - \overline{V_{Bf}} + \overline{Z_l} * \overline{I_{Bf}} = m * \overline{Z_l} * (\overline{I_{Af}} * e^{j\delta} + \overline{I_{Bf}}) \tag{5}$$

The unknowns in equation (5) are the fault location parameter m and the complex number $\langle\delta\rangle = e^{j\delta}$. Equation (5) may be separated into real and imaginary parts to form two equations. The line impedance is represented as $Z_l = R + jX$. However, if $\langle\delta\rangle$ is represented in polar form (e.g., $\langle\delta\rangle = \cos(\delta) + j\sin(\delta)$), there will be two real unknowns, namely the fault location parameter m and the synchronization angle δ. Thus, the following two equations with two unknowns must be solved:

$$Re(\overline{V_{Af}}) * \cos\delta - Im(\overline{V_{Af}}) * \sin\delta - Re(\overline{V_{Bf}}) + C = m*(A*\cos\delta - B*\sin\delta + C) \tag{6}$$

$$Re(\overline{V_{Af}}) * \sin\delta + Im(\overline{V_{Af}}) * \cos\delta - Im(\overline{V_{Bf}}) + D = m*(A*\sin\delta + B*\cos\delta + D) \tag{7}$$

The coefficients A, B, C, and D in equations (6) and (7) are given by:

$$A = R*Re(\overline{I_{Af}}) - X*Im(\overline{I_{Af}}) \tag{8}$$

$$B = R*Im(\overline{I_{Af}}) + X*Re(\overline{I_{Af}}) \tag{9}$$

$$C = R*Re(\overline{I_{Bf}}) - X*Im(\overline{I_{Bf}}) \tag{10}$$

$$D = R*Im(\overline{I_{Bf}}) + X*Re(\overline{I_{Bf}}) \tag{11}$$

The next step in the derivation is to divide equation (6) by equation (7) to form one equation with one unknown, δ. After rearranging this equation and cancelling a number of terms, the resulting equation is:

$$a*\sin\delta + b*\cos\delta + c = 0 \tag{12}$$

where $$a = -C*Re(\overline{V_{Af}}) - D*Im(\overline{V_{Af}}) - A*Re(\overline{V_{Bf}}) - B*Im(\overline{V_{Bf}}) + AC + BD \tag{13}$$

$$b = D*Re(\overline{V_{Af}}) - C*Im(\overline{V_{Af}}) - B*Re(\overline{V_{Bf}}) + A*Im(\overline{V_{Bf}}) + BC - AD \tag{14}$$

$$c = B*Re(\overline{V_{Af}}) - A*Im(\overline{V_{Af}}) - D*Re(\overline{V_{Bf}}) + C*Im(\overline{V_{Bf}}) \tag{15}$$

Equation (12) may be solved for the synchronization angle δ, e.g., by an iterative Newton-Raphson method. For example, one set of equations for iteratively calculating the angle δ (in radians) is:

$$\delta_{k+1} = \delta_k - \frac{F(\delta_k)}{F'(\delta_k)} \quad (16)$$

where $$F(\delta_k) = b^* \cos \delta_k + a^* \sin \delta_k + C \quad (17)$$

$$F'(\delta_k) = a^* \cos \delta_k - b^* \sin \delta_k \quad (18)$$

The iterative procedure exhibits a quadratic convergence and may be stopped when the difference between the last two calculations is smaller than a predetermined limit (e.g., $\delta_{k+1} - \delta_k < 10^{-4}$). The present inventor has discovered that a good initial guess of the value of δ is not a problem, although some initial guess (e.g., zero) is required.

Once the synchronization angle is known, the fault location parameter m can be calculated with equation (6) or equation (7). Equations (6) and (7) respectively yield equations (19a) and (19b):

$$m = \frac{Re(\overline{V_{Af}})^*\cos\delta - Im(\overline{V_{Af}})^*\sin\delta - Re(\overline{V_{Bf}}) + C}{A^*\cos\delta - B^*\sin\delta + C} \quad (19a)$$

$$m = \frac{Re(\overline{V_{Af}})^*\sin\delta + Im(\overline{V_{Af}})^*\cos\delta - Im(\overline{V_{Bf}}) + D}{A^*\sin\delta + B^*\cos\delta + D} \quad (19b)$$

Equations (8), (9), (10), (11), (13), (14), (15), and (19) are applicable for different types of faults. These equations are derived for single-phase cases. However, they may easily be applied in multi-phase cases. The appropriate phase quantities can be used. For example, in the case of a phase a-to-ground fault, phase a voltages and currents at both terminals may be used in these equations. However, the phase currents should be compensated for a zero sequence current, which would introduce undesirable zero sequence effects. In addition, different phases are not decoupled. Furthermore, sensitivity problems, such as small differences either in magnitudes (between voltages at the terminals) or in angles (between corresponding voltage and current), may be associated with phase quantities. Thus, this approach is not suggested.

By using positive sequence, negative sequence, or zero sequence voltages, currents, and line impedances, these equations may be written as:

$$A_{012} = R_{012}*Re(I_{Af})_{012} - X_{012}*Im(I_{Af})_{012} \quad (8')$$

$$B_{012} = R_{012}*Im(I_{Af})_{012} + X_{012}*Re(I_{Af})_{012} \quad (9')$$

$$C_{012} = R_{012}*Re(I_{Bf})_{012} - X_{012}*Im(I_{Bf})_{012} \quad (10')$$

$$D_{012} = R_{012}*Im(I_{Bf})_{012} + X_{012}*Re(I_{Bf})_{012} \quad (11')$$

$$a_{012} = -C_{012}*Re(V_{Af})_{012} - D_{012}*Im(V_{Af})_{012} - A_{012}*Re(V_{Bf})_{012} - B_{012}*Im(V_{Bf})_{012} + A_{012}*C_{012} + B_{012}*D_{012} \quad (13')$$

$$b_{012} = D_{012}*Re(V_{Af})_{012} - C_{012}*Im(V_{Af})_{012} - B_{012}*Re(V_{Bf})_{012} + A_{012}*Im(V_{Bf})_{012} + B_{012}*C_{012} - A_{012}*D_{012} \quad (14')$$

$$c_{012} = B_{012}*Re(V_{Af})_{012} - A_{012}*Im(V_{Af})_{012} - D_{012}*Re(V_{Bf})_{012} + C_{012}*Im(V_{Bf})_{012} \quad (15')$$

$$m = \frac{Re(V_{Af})_{012} * \sin\delta + Im(V_{Af})_{012} * \cos\delta - Im(V_{Bf})_{012} + D_{012}}{A_{012} * \sin\delta + B_{012} * \cos\delta + D_{012}} \quad (19b')$$

Figure 5A:
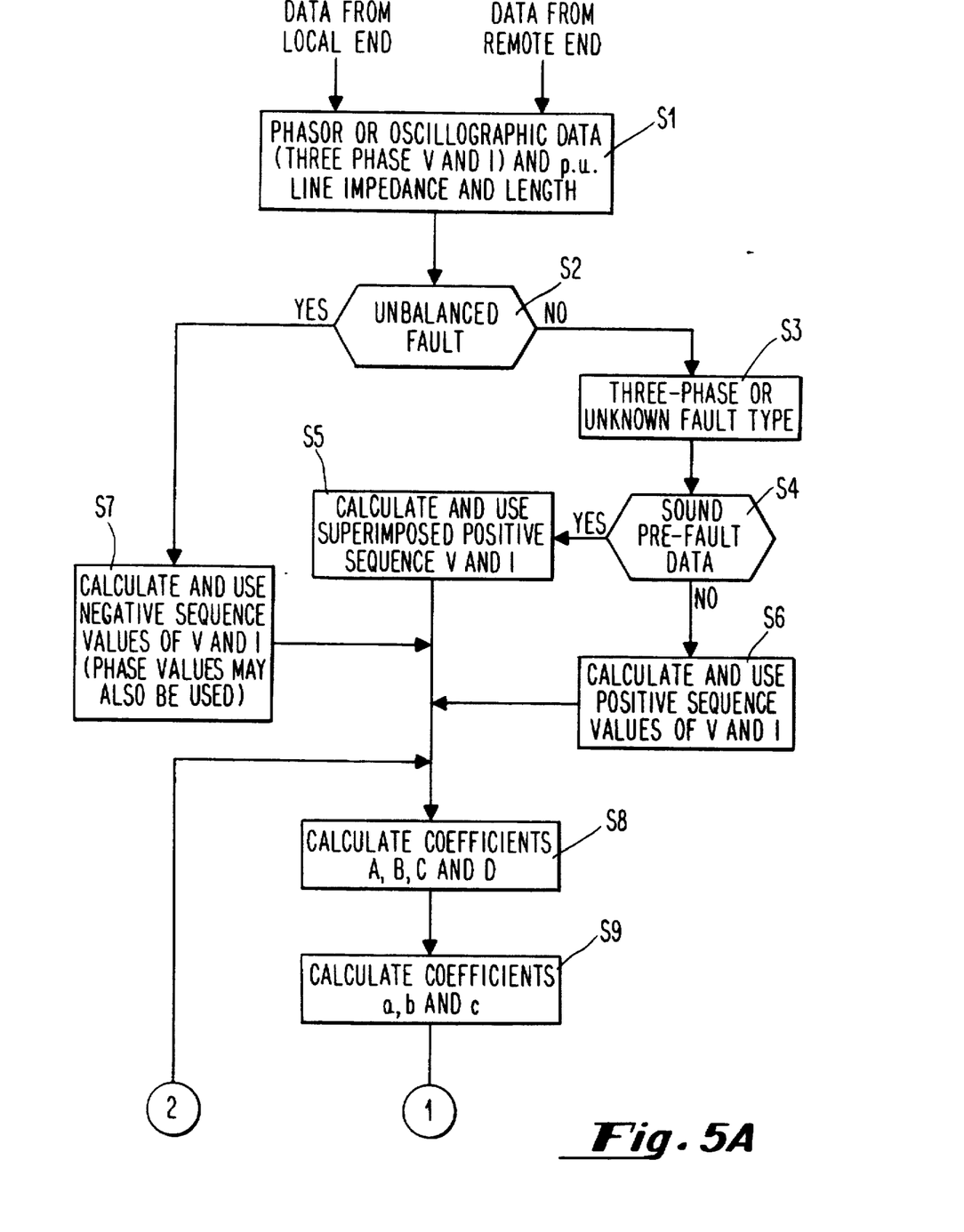
FIGS. 5A–5B are a flowchart of the operation of a fault location system in accordance with the present invention.

In order to avoid zero sequence effects, the zero sequence values are not recommended. If the positive sequence voltages and currents are used, fault type selection is not required. The negative sequence voltages and currents may be used for all unbalanced faults (phase-to-phase, phase-to-phase-to-ground, and phase-to-ground). However, only positive sequence values can be calculated for three-phase, balanced faults. Tests have shown that, for extremely large values of fault resistance, the implementation of the positive sequence values may slightly degrade accuracy because the load may cause sensitivity problems. This problem is much smaller for the negative sequence quantities because the pre-fault, negative sequence values (values of the negative sequence load) are negligible for the transmission lines. Thus, to avoid the influence of the load, the negative sequence quantities or a difference between the fault and the pre-fault positive sequence values may be used. The difference (superimposed) values require sound pre-fault data related in phase to the fault quantities (while oscillographic data will provide the required data, relay phasor values may not). Thus, negative sequence values are proposed for all unbalanced faults. In addition, positive sequence values are required for three-phase faults or if the fault type selection is not accurate or not available. If sound pre-fault data are not available during the three-phase or unknown fault, the positive sequence fault values should be used. This procedure is shown in FIG. 5A. The system performance is not influenced by an unbalance in the load flow.

Compensation for Shunt Admittances

If the fault location method does not compensate for shunt admittances, considerable error may be introduced, particularly with higher voltage levels. Such compensation may be provided by replacing the measured currents at terminals A and B ($I_{Af}$ and $I_{Bf}$) with the currents $I_{Af}'$ and $I_{Bf}'$, respectively. ($I_{Af}'$ and $I_{Bf}'$ represent currents beyond the points A' and B' and beyond the shunt admittances $mY_l/2$ and $(1-m)Y_l/2$, as shown in FIG. 3.) The shunt capacitances parallel to the fault resistance are irrelevant for the fault location calculation. However, the value of the fault location parameter m must be initially estimated for compensation. Shunt admittance compensation may be performed as an iterative procedure.

Compensation for Long Lines

For applications involving long lines, distributed line models may be employed to achieve a more accurate fault location estimation. For example, the Π model (FIG. 3) may be related to an ABCD model with the following equations for series impedance (equation 20) and shunt admittance (equation 21):

$$Z_{ld} = Z_l \left( \frac{\sinh(v^*l)}{v^*l} \right) \quad (20)$$

$$\frac{Y_{ld}}{2} = \frac{Y_l}{2} \left( \frac{\tanh\left(\frac{v^*l}{2}\right)}{\frac{v^*l}{2}} \right) \quad (21)$$

where, $v = \sqrt{zy}$ $l = \frac{x}{m}$ $Z_l = z^*l$ $Y_l = y^*l$

In the above equations, v is the propagation constant, l is the line length, z is the series impedance (e.g., in ohms per mile), y is the shunt admittance (e.g., in siemens per mile), and x is the fault location in miles.

Equations (20) and (21) may be used in connection with the Π model to determine $Z_{ld}$ and $Y_{ld}$ (i.e., the distributed line impedance and admittance per unit length) on either side of the fault. The series impedance and shunt admittance seen from the terminal A side of the model are given by equations (22) and (23):

$$Z_{ldA} = Z_l \left( \frac{\sinh(v^*x)}{v^*x} \right) \qquad (22)$$

$$= Z_1 \left( \frac{\sinh(v^*l^*m_{old})}{v^*l^*m_{old}} \right)$$

$$= R_A + jX_A$$

$$\frac{Y_{ldA}}{2} = \frac{Y}{2} \left( \frac{\tanh\left(\frac{v^*x}{2}\right)}{\frac{v^*x}{2}} \right) \qquad (23)$$

$$= \frac{Y}{2} \frac{\tanh\left(\frac{v^*l^*m_{old}}{2}\right)}{\frac{v^*l^*m_{old}}{2}}$$

In these equations, $m_{old}$ represents the initial value of the fault location estimation.

The series impedance and shunt admittance seen from the B side are given by equations (24) and (25):

$$Z_{ldB} = Z_l \left( \frac{\sinh(v^*(1-x))}{v^*(1-x)} \right) \qquad (24)$$

$$= Z_1 \left( \frac{\sinh(v^*l^*(1-m_{old}))}{v^*l^*(1-m_{old})} \right)$$

$$= R_B + jX_B$$

$$\frac{Y_{ldB}}{2} = \frac{Y}{2} \left( \frac{\tanh\left(\frac{v^*(1-x)}{2}\right)}{\frac{v^*(1-x)}{2}} \right) \qquad (25)$$

$$= \frac{Y}{2} \frac{\tanh\left(\frac{v^*l^*(1-m_{old})}{2}\right)}{\frac{v^*l^*(1-m_{old})}{2}}$$

The initial value of the fault location estimation ($m_{old}$) may be determined without compensating for distributed parameters. The coefficients A, B, C, D may be calculated as follows:

$$A = R_A * Re(\overline{I_{Af}}) - X_A * Im(\overline{I_{Af}}) \qquad (26)$$

$$B = R_A * Im(\overline{I_{Af}}) + X_A * Re(\overline{I_{Af}}) \qquad (27)$$

$$C = R_B * Re(\overline{I_{Bf}}) - X_B * Im(\overline{I_{Bf}}) \qquad (28)$$

$$D = R_B * Im(\overline{I_{Bf}}) + X_B * Re(\overline{I_{Bf}}) \qquad (29)$$

The fault location procedure would continue as described above (i.e., with equations (26)–(29) replacing equations (8)–(11)). In addition, $Y_{lda}$ and $Y_{ldb}$ should replace $Y_l$ in calculation of $I'_{Af}$ and $I'_{Bf}$, respectively, for shunt admittance compensation. Compensation may also be provided with an iterative procedure until the difference between the last two estimates is less than a prescribed limit (e.g., $10^{-3}$).

Figure 4:
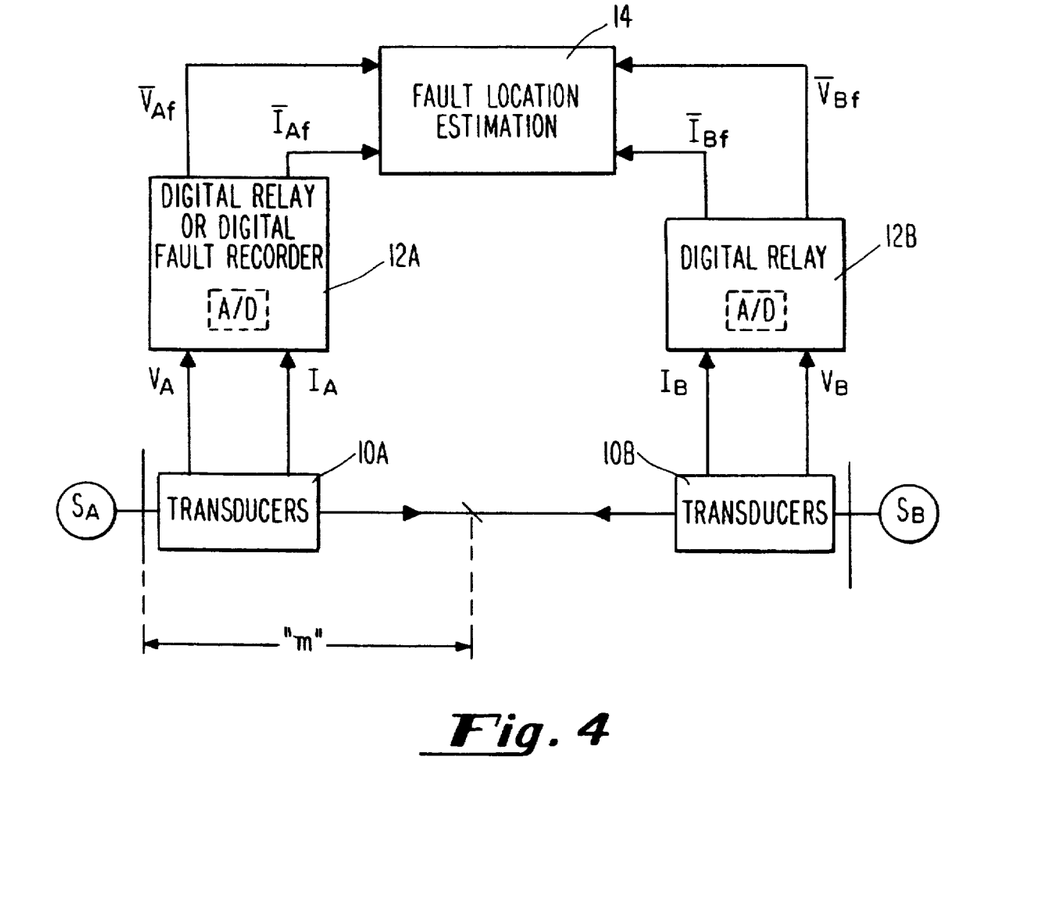
FIG. 4 is a block diagram of one preferred embodiment of a fault location system in accordance with the present invention.

FIG. 4 is a block diagram of one preferred embodiment of a fault location system in accordance with the present invention. The system includes voltage/current transducers 10A, 10B located at terminals A and B, respectively; digital relays 12A and 12B respectively coupled to transducer blocks 10A and 10B; and a fault location estimation processor 14, which may comprise a substation controller at substation $S_A$ or substation $S_B$, a relay at A or B, a stand alone computer at A or B, or a computer at a central location. According to the present invention, the digital relays 12A, 12B receive analog voltage and current signals ($V_A$, $I_A$, $V_B$, $I_B$) from the respective transducers 10A, 10B and output digital phasor or oscillographic data to the fault location estimation block 14. The fault location estimation block is programmed to provide the fault location parameter m in accordance with the above-described procedure. In embodiments wherein the relays provide oscillographic data, the fault location estimation block 14 determines phasor data from the oscillographic data, which represents the currents and voltages over one or more cycles. The details of such calculations are well known to those skilled in the art.

Figure 5B:
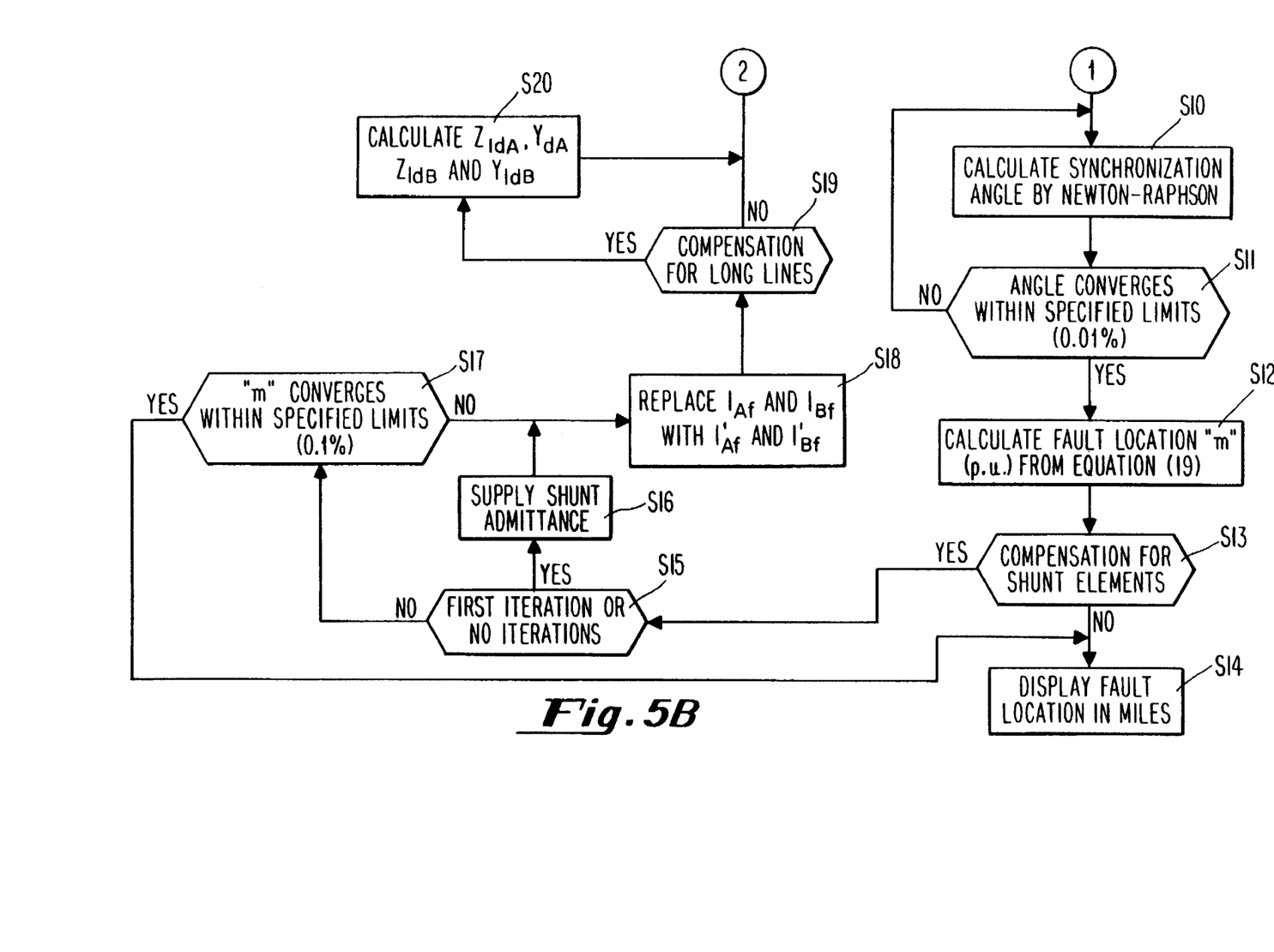

FIGS. 5A and 5B are, collectively, a flowchart of one preferred method of operation of a fault location system in accordance with the present invention. This method may be implemented, for example, with software in the fault location estimation block 14 (FIG. 4).

Referring now to FIG. 5A, a first step S1 comprises receiving data from a local end (e.g., terminal A) and a remote end (terminal B). As discussed above, this data may be phasor or oscillographic data representing the three phase voltages and currents measured at the respective ends (A and B) of the a, b, and c phase conductors of the transmission system. In addition, the system determines the p.u. (per unit length) line impedance and the line length. This latter information could be provided by a user or read from a memory device.

At a subsequent step S2 the system determines whether the fault (which the system previously determined had occurred) is (or was) an unbalanced (not three-phase) fault. If not an unbalanced fault, or fault type selection if not available, the system at step S3 identifies the fault as a three-phase or unknown fault type. At step S4, the system decides whether the pre-fault data is sound. If the data is sound, the system at step S5 calculates superimposed voltage and current data. The superimposed values represent the differences between post-fault and pre-fault values. (This is an implementation of the Thevenin theorem. The faulted system is decomposed into two systems, superimposed and pre-fault.)

If the prefault data is not sound, the system at Step S6 uses the positive sequence values of voltage and current.

If the system, at step S2, decided that the fault was unbalanced, it calculates negative sequence values of voltage and current at step S7.

At step S8, the system calculates the above-described A, B, C and D coefficients. At step S9, the system calculates the above-described a, b, and c coefficients.

Referring now to FIG. 5B, the system at step S10 calculates the synchronization angle δ by an iterative method, for example, the Newton-Raphson method. At step S11, the system determines whether the angle δ has converged within specified limits, for example, 0.01%. If not, the routine branches to step S10 and recalculates the angle δ. If acceptable convergence has been achieved, the system at step S12 calculates the fault location parameter m.

At step S13, the system determines whether compensation for shunt elements is required. If not, the method proceeds to step S14 and the system displays the fault location estimation, for example, in miles from a prespecified point. If compensation for shunt elements is required, the system at step S15 obtains the shunt admittance, e.g., from a user or memory. At step S16, the system determines whether this is a first iteration or no iterations are required. If not, the system at step S17 determines whether m has converged within specified limits, for example, 0.1%. If it was determined at step S16 that this was a first iteration or no iterations were required, or does not converge within specified limits, the system at S18 replaces $I_{AF}$ and $I_{BF}$ with $I'_{AF}$ and $I'_{BF}$ as described above. If m converges within specified limits, the procedure is stopped, and fault location is displayed (step S14).

At step S19, the system determines whether compensation for long lines is required. If not, the procedures branches to step S8 (FIG. 5A). If compensation for long lines is required, the system at step S20 calculates $Z_{ldA}$, $Y_{ld}$, $Z_{ldB}$, and $Y_{ldB}$ as described above. The method then branches to step S8 (FIG. 5A).

The above description of preferred embodiments is not intended to limit the scope of protection of the following claims. Thus, for example, except where they are expressly so limited, the following claims are not limited to applications involving three-phase power systems or power systems employing a 60 Hz fundamental frequency. Moreover, the claims are not limited to fault location systems associated with any particular part (i.e., transformer, feeder, high power transmission line, etc.) of a power distribution system.

I claim:

1. A fault location system for locating a fault associated with one or more conductors of an electric power transmission or distribution system, comprising:

a first transducer set for measuring a first voltage ($V_A$) and a first current ($I_A$), at a first prescribed location on at least one conductor;

a second transducer set for measuring a second voltage ($V_B$) and a second current ($I_B$) at a second prescribed location on said at least one conductor;

(c) a first relay, coupled to said first transducer set, for generating data ($V_{Af}$, $I_{Af}$), indicative of an amplitude and phase of said first voltage and current;

(d) second relay, coupled to said second transducer set, for generating data $V_{Bf}$, $I_{Bf}$) indicative of an amplitude and phase of said second voltage and current; and (e) a fault location estimation processor, coupled to said first and second relays, for generating a fault location parameter m indicative of the location of the fault; wherein m is obtained from one of the following equations:

$$m = \frac{Re(\overline{V_{Af}})*\cos\delta - Im(\overline{V_{Af}})*\sin\delta - Re(\overline{V_{Bf}}) + C}{A*\cos\delta - B*\sin\delta + C}$$

$$m = \frac{Re(\overline{V_{Af}})*\sin\delta + Im(\overline{V_{Af}})*\cos\delta - Im(\overline{V_{Bf}}) + D}{A*\sin\delta + B*\cos\delta + D}$$

wherein $\delta$ represents a phase difference between said first and second voltages, A is a real number having a value which is a first predetermined function of $I_{Af}$ and a resistance and reactance of said at least one conductor, B is a real number having a value which is a second predetermined function of $I_{Af}$ and said resistance and reactance of said at least one conductor, C is a real number having a value which is a first predetermined function of $I_{Bf}$ and said resistance and reactance of said at least one conductor; and D is a real number having a value which is a fourth predetermined function of $I_{Bf}$ and said resistance and reactance of said at least one conductor.

2. A fault location system as recited in claim 1, wherein $\delta$ is obtained from the equations:

$$\delta_{k+1} = \delta_k - \frac{F(\delta_k)}{F'(\delta_k)}$$

$F(\delta_k) = b^* \cos\delta_k + a^* \sin\delta_k + C$ $F'(\delta_k) = a^* \cos\delta_k - b^* \sin\delta_k$ $a = -C*Re(\overline{V_{Af}}) - D*Im(\overline{V_{Af}}) - A*Re(\overline{V_{Bf}}) - B*Im(\overline{V_{Bf}}) + AC + BD$ $b = D*Re(\overline{V_{Af}}) - C*Im(\overline{V_{Af}}) - B*Re(\overline{V_{Bf}}) + A*Im(\overline{V_{Bf}}) + BC - AD$ $c = B*Re(\overline{V_{Af}}) - A*Im(\overline{V_{Af}}) - D*Re(\overline{V_{Bf}}) + C*Im(\overline{V_{Bf}})$ 3. A fault location system as recited in claim 2, wherein A, B, C, and D are obtained from:

$A = R*Re(\overline{I_{Af}}) - X*Im(\overline{I_{Af}})$ $B = R*Im(\overline{I_{Af}}) + X*Re(\overline{I_{Af}})$ $C = R*Re(\overline{I_{Bf}}) - X*Im(\overline{I_{Bf}})$ $D = R*Im(\overline{I_{Bf}}) + X*Re(\overline{I_{Bf}})$.

4. A fault location system for locating a fault associated with one or more conductors of an electric power transmission or distribution system, comprising:

(a) a first transducer set for measuring a first voltage ($V_A$) and a first current ($I_A$) at a first prescribed location on at least one conductor;

(b) a second transducer set for measuring a second voltage ($V_B$) and a second current ($I_B$) at a second prescribed location on said at least one conductor;

(c) a first relay, coupled to said first transducer set, for generating data ($V_{Af}$, $I_{Af}$) indicative of an amplitude and phase of said first voltage and current;

(d) a second relay, coupled to said second transducer set, for generating data ($V_{Bf}$, $I_{Bf}$) indicative of an amplitude and phase of said second voltage and current;

(e) a fault location estimation processor, coupled to said first and second relays, for generating a fault location parameter m indicative of the location of the fault and for determining whether compensation is required of parameter m to compensate for long conductors in the electric transmission or distribution system; wherein m is obtained from one of the following equations:

$$m = \frac{Re(\overline{V_{Af}})*\cos\delta - Im(\overline{V_{Af}})*\sin\delta - Re(\overline{V_{Bf}}) + C}{A*\cos\delta - B*\sin\delta + C}$$

$$m = \frac{Re(\overline{V_{Af}})*\sin\delta + Im(\overline{V_{Af}})*\cos\delta - Im(\overline{V_{Bf}}) + D}{A*\sin\delta + B*\cos\delta + D}$$

wherein $\delta$ represents a phase difference between said first and second voltages, A is a real number having a value which is a first predetermined function of $I_{Af}$ and a resistance and reactance of said at least one conductor, B is a real number having a value which is a second predetermined function of $I_{Af}$ and said resistance and reactance of said at least one conductor, C is a real number having a value which is a first predetermined function of $I_{Bf}$ and said resistance and reactance of said at least one conductor, and D is a real number having a value which is a fourth predetermined function of $I_{Bf}$ and said resistance and reactance of said at least one conductor.

5. A fault location system as recited in claim 2, wherein said fault location processor determines whether compensation is required to parameter m for compensating for long conductors in the electric transmission or distribution system by computing A, B, C, and D from:

$$A = R_A * Re(\overline{I_{Af}}) - X_A * Im(\overline{I_{Af}})$$

$$B = R_A * Im(\overline{I_{Af}}) + X_A * Re(\overline{I_{Af}})$$

$$C = R_B * Re(\overline{I_{Bf}}) - X_B * Im(\overline{I_{Bf}})$$

$$D = R_B * Im(\overline{I_{Bf}}) + X_B * Re(\overline{I_{Bf}})$$

wherein $R_A$, $R_B$, $X_A$, and $X_B$ are resistance and reactance values.

6. A fault location system for locating a fault associated with one or more conductors of an electric power transmission or distribution system, comprising:

(a) a first transducer set for measuring a first voltage ($V_A$) and a first current ($I_A$) at a first prescribed location on at least one conductor;

(b) a second transducer set for measuring a second voltage ($V_B$) and a second current ($I_B$) at a second prescribed location on said at least one conductor;

(c) a first relay, coupled to said first transducer set, for generating data ($V_{Af}$, $I_{Af}$) indicative of an amplitude and phase of said first voltage and current;

(d) a second relay, coupled to said second transducer set, for generating data ($V_{Bf}$, $I_{Bf}$) indicative of an amplitude and phase of said second voltage and current;

(e) a fault location estimation processor, coupled to said first and second relays, for generating a fault location parameter m indicative of the location of the fault; and for determining whether compensation is required of parameter m to compensate for shunt elements in the electric transmission or distribution system; wherein m is obtained from one of the following equations:

$$m = \frac{Re(\overline{V_{Af}})*\cos\delta - Im(\overline{V_{Af}})*\sin\delta - Re(\overline{V_{Bf}}) + C}{A*\cos\delta - B*\sin\delta + C}$$

$$m = \frac{Re(\overline{V_{Af}})*\sin\delta + Im(\overline{V_{Af}})*\cos\delta - Im(\overline{V_{Bf}}) + D}{A*\sin\delta + B*\cos\delta + D}$$

wherein $\delta$ represents a phase difference between said first and second voltages, A is a real number having a value which is a tint predetermined function of $I_{Af}$ and a resistance and reactance of said at least one conductor, B is a real number having a value which is a second predetermined function of $I_{Af}$ and said resistance and reactance of said at least one conductor, C is a real number having a value which is a first predetermined function of $I_{Bf}$ and said resistance and reactance of said at least one conductor, and D is a real number having a value which is a fourth predetermined function of $I_{Bf}$ and said resistance and reactance of said at least one conductor.

* * * * *